United States Patent
Huffman et al.

(10) Patent No.: US 10,029,914 B2
(45) Date of Patent: Jul. 24, 2018

(54) INTERNALLY GENERATED DFT STEPPED HYSTERESIS SWEEP FOR ELECTROSTATIC MEMS

(71) Applicant: CAVENDISH KINETICS, INC., San Jose, CA (US)

(72) Inventors: James Douglas Huffman, McKinney, TX (US); Cong Quoc Khieu, San Jose, CA (US); Robertus Petrus Van Kampen, S-Hertogenbosch (NL); Karl F. Smayling, San Jose, CA (US); Vikram Joshi, Mountain View, CA (US)

(73) Assignee: CAVENDISH KINETICS, INC., San Jose, CA (US)

( * ) Notice: Subject to any disclaimer, the term of this patent is extended or adjusted under 35 U.S.C. 154(b) by 89 days.

(21) Appl. No.: 14/916,884

(22) PCT Filed: Apr. 23, 2015

(86) PCT No.: PCT/US2015/027201
§ 371 (c)(1),
(2) Date: Mar. 4, 2016

(87) PCT Pub. No.: WO2016/036422
PCT Pub. Date: Mar. 10, 2016

(65) Prior Publication Data
US 2016/0297677 A1    Oct. 13, 2016

Related U.S. Application Data

(63) Continuation-in-part of application No. PCT/US2014/054213, filed on Sep. 5, 2014.
(Continued)

(51) Int. Cl.
*H01L 29/93*  (2006.01)
*B81C 99/00*  (2010.01)
(Continued)

(52) U.S. Cl.
CPC ............. *B81C 99/003* (2013.01); *H01G 5/16* (2013.01); *B81B 2201/016* (2013.01);
(Continued)

(58) Field of Classification Search
CPC ............................ H01L 23/5228; H01L 29/93
(Continued)

(56) References Cited

U.S. PATENT DOCUMENTS 7,633,359 B2 * 12/2009 El Rai ................. H01L 23/5223
    333/175
8,134,375 B2 * 3/2012 Boom ...................... G01D 3/08
    324/661
2009/0320557 A1 12/2009 Sammoura et al.

FOREIGN PATENT DOCUMENTS

CN    101013637 A    8/2007
CN    101055188 A    10/2007
(Continued)

OTHER PUBLICATIONS

Search Report issued in corresponding Chinese Patent Application No. 201580001969.3, dated Mar. 20, 2018 (2 pages).
(Continued)

*Primary Examiner* — Chandra Chaudhari
(74) *Attorney, Agent, or Firm* — Patterson & Sheridan, LLP; Steven Versteeg

(57) ABSTRACT

The present invention generally relates to a mechanism for testing a MEMS hysteresis. A power management circuit may be coupled to the electrodes that cause the movable plate that is disposed between the electrodes in a MEMS device to move. The power management circuit may utilize a charge pump, a comparator and a resistor ladder.

22 Claims, 19 Drawing Sheets

Related U.S. Application Data

(60) Provisional application No. 61/874,653, filed on Sep. 6, 2013.

(51) Int. Cl.
*H01G 5/16* (2006.01)
*H01L 23/522* (2006.01)
*G01R 27/26* (2006.01)

(52) U.S. Cl.
CPC .... *B81B 2207/015* (2013.01); *G01R 27/2605* (2013.01); *H01L 23/5228* (2013.01); *H01L 29/93* (2013.01)

(58) Field of Classification Search
USPC .................................................. 257/600, 602
See application file for complete search history.

(56) References Cited

FOREIGN PATENT DOCUMENTS

| | | |
|---|---|---|
| CN | 102522262 A | 6/2012 |
| WO | 2013033613 A2 | 3/2013 |

OTHER PUBLICATIONS

Office Action issues in corresponding Chinese Patent Application dated Mar. 20, 2018 (16 pages).

* cited by examiner

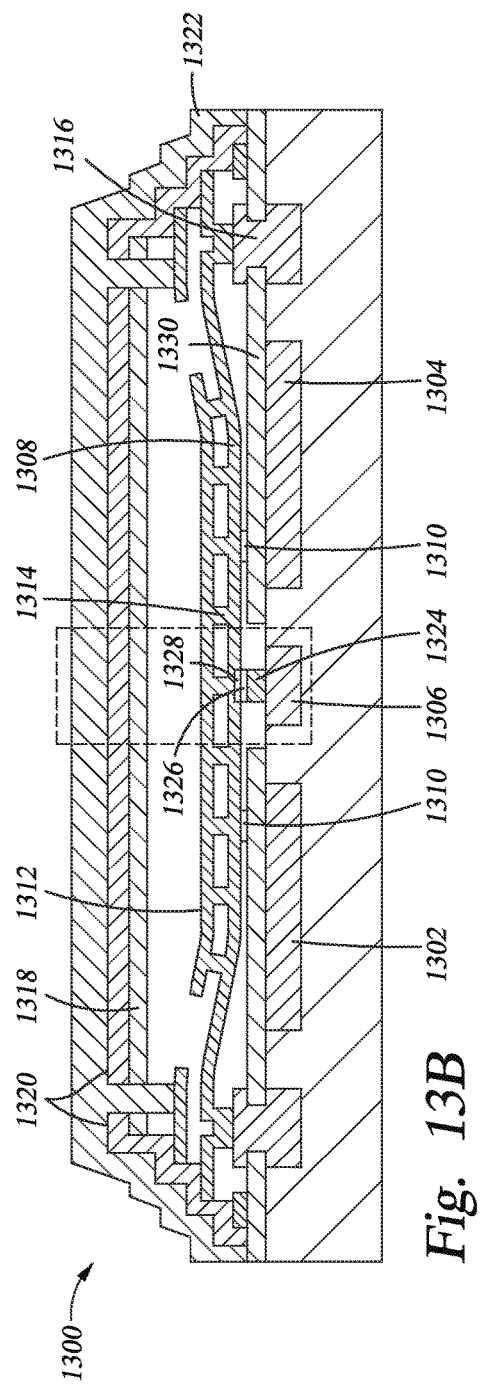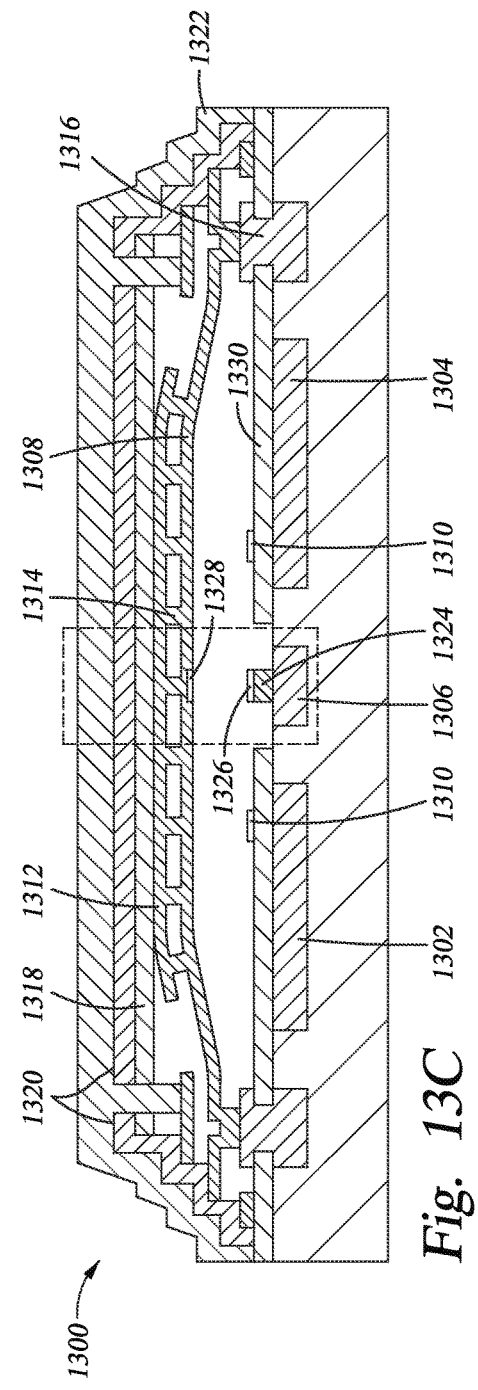
Fig. 13B
Fig. 13C

INTERNALLY GENERATED DFT STEPPED HYSTERESIS SWEEP FOR ELECTROSTATIC MEMS

BACKGROUND OF THE DISCLOSURE

Field of the Disclosure

Embodiments of the present disclosure generally relate to a mechanism for testing a micro-electromechanical system (MEMS) hysteresis.

Description of the Related Art

In operating a MEMS digital variable capacitor (DVC), a plate moves between a first position and a second position. The plate moves by applying a voltage to an actuation electrode. Once the electrode voltage reaches a certain voltage, oftentimes referred to as a snap-in voltage, the plate moves towards the electrode. The plate moves back to the original position once the voltage is lowered to a release voltage. The release voltage is typically lower than the snap-in voltage due to the higher electrostatic forces when the plate is close to the actuation electrode and due to stiction between the plate and the surface to which the plate is in contact once moved closer to the electrode.

Because the plate doesn't release at the same voltage as the snap-in voltage, the MEMS DVC has a hysteresis curve. The snap-in voltage and the release voltage, while different, should be known for the MEMS DVC to operate efficiently.

Therefore, there is a need in the art for a method and device for effectively measuring the hysteresis curve for a MEMS DVC.

SUMMARY OF THE DISCLOSURE

The present disclosure generally relates to a mechanism for testing a MEMS hysteresis. A power management circuit may be coupled to the electrodes that cause the movable plate to move between the electrodes in a MEMS device. The power management circuit may utilize a charge pump, a comparator and a resistor ladder.

In one embodiment, a device comprises a first MEMS device having a first electrode, a second electrode, and a plate movable between a first position spaced a first distance from the first electrode and a second position spaced a second distance from the first electrode; a power source coupled to both the first electrode and the second electrode; an ammeter coupled to the first electrode; a voltmeter coupled to both the first electrode and the second electrode; a first switch coupled to the plate and to ground; and a second switch coupled to the plate and to a power management circuit.

In another embodiment, a MEMS DVC comprises at least one MEMS device, the MEMS device comprising a movable plate, an RF electrode, one or more pull-down electrodes and one or more pull-up electrodes; a first switch coupled to either the one or more pull-down electrodes or the one or more pull-up electrodes, wherein the first switch is additionally coupled to ground; a second switch coupled to either the one or more pull-down electrodes or the one or more pull-up electrodes; and a power management system coupled to the second switch, wherein the at least one MEMS device, the first switch, the second switch and the power management system are all disposed on a semiconductor chip.

In another embodiment, a method of testing a MEMS DVC, the MEMS DVC including at least one MEMS device, the MEMS device comprising a movable plate, an RF electrode and one or more pull-down electrodes, is disclosed. The method comprises applying a first voltage to the one or more pull-down electrodes to move the movable plate from a free standing capacitance state to an increased capacitance; measuring a capacitance of the MEMS device; applying a second voltage to the one or more pull-down electrodes; measuring the capacitance of the MEMS device; detecting the capacitance of the MEMS device equals a maximum capacitance of the MEMS device; removing the second voltage from the one or more pull-down electrodes; measuring the capacitance of the MEMS device; removing the first voltage from the one or more pull-down electrodes; measuring the capacitance of the MEMS device; and detecting the capacitance of the MEMS device equals the free standing state capacitance.

In another embodiment, a method of testing a MEMS DVC, the MEMS DVC including at least one MEMS device, the MEMS device comprising a movable plate, an RF electrode and one or more pull-up electrodes, is disclosed. The method comprises applying a first voltage to the one or more pull-up electrodes to move the movable plate from a free standing capacitance state to a decreased capacitance; measuring a capacitance of the MEMS device; applying a second voltage to the one or more pull-up electrodes; measuring the capacitance of the MEMS device; detecting the capacitance of the MEMS device equals a minimum capacitance of the MEMS device; removing the second voltage from the one or more pull-up electrodes; measuring the capacitance of the MEMS device; removing the first voltage from the one or more pull-up electrodes; measuring the capacitance of the MEMS device; and detecting the capacitance of the MEMS device equals the free standing state capacitance.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 13B is a schematic cross-sectional illustration of the MEMS DVC device of FIG. 13A in the $C_{max}$ state.

FIG. 13C is a schematic cross-sectional illustration of the MEMS DVC device of FIG. 13A in the $C_{min}$ state.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a mechanism for testing a MEMS hysteresis. A power management circuit may be coupled to the electrodes that cause the movable plate that is disposed between the electrodes to move in a MEMS device. The power management circuit may utilize a charge pump, a comparator and a resistor ladder.

A MEMS DVC device may operate with electrostatic forces. As discussed herein, the mechanism operated by a force acting on the moveable MEMS element when a voltage V is applied between the movable MEMS element (e.g., movable plate) and a control electrode. This electrostatic force scales with $(V/gap)^2$. The mechanical counterbalance force comes from a spring suspension system and typically scales linearly with the displacement. The result is that with an increasing voltage V the MEMS device moves a certain distance δ toward the control-electrode. This movement reduces the gap between the movable MEMS element (oftentimes referred to as a moveable plate) and the electrode, which in turn increases the electrostatic force further. For small voltages, an equilibrium position between the initial position and the electrode is found. However, when the voltage exceeds a certain threshold level (the pull-in voltage), the device displacement is such that the electrostatic force rises faster than the mechanical counterbalance force and the device rapidly snaps-in towards the control-electrode until it comes in contact.

Figure 1:
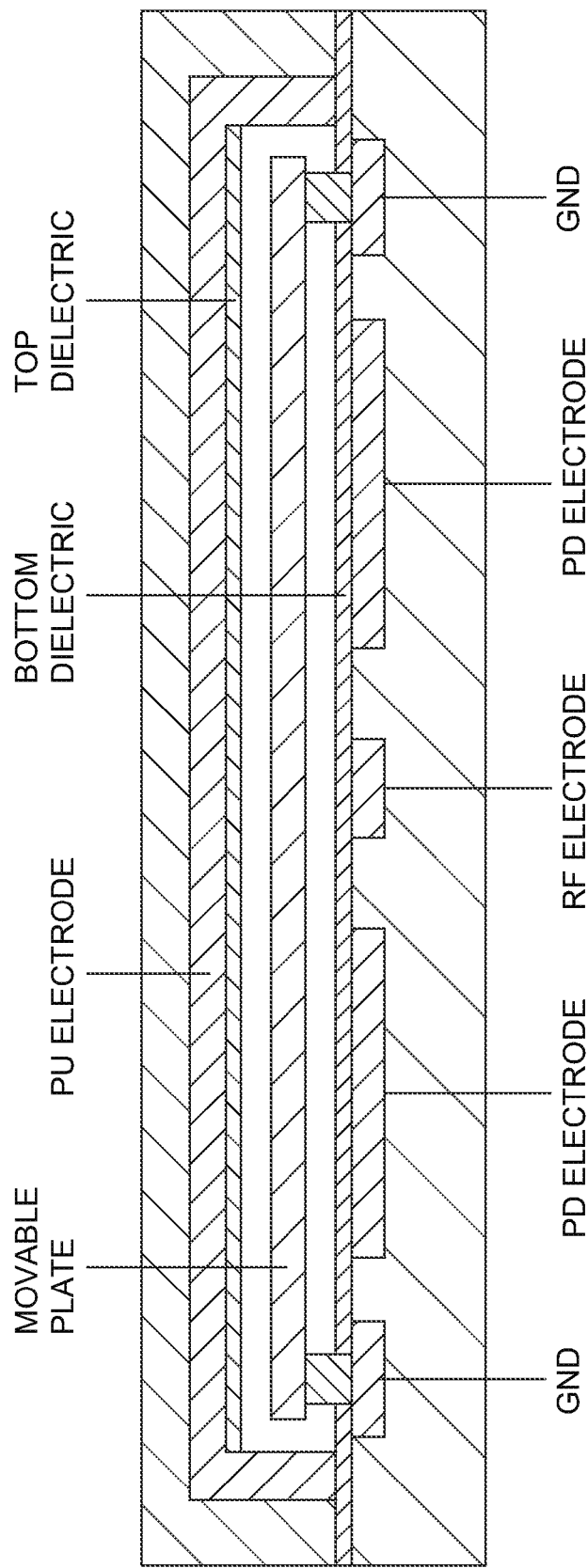
FIG. 1 is a schematic cross-sectional illustration of a MEMS DVC device in the free standing state.
Figure 2:
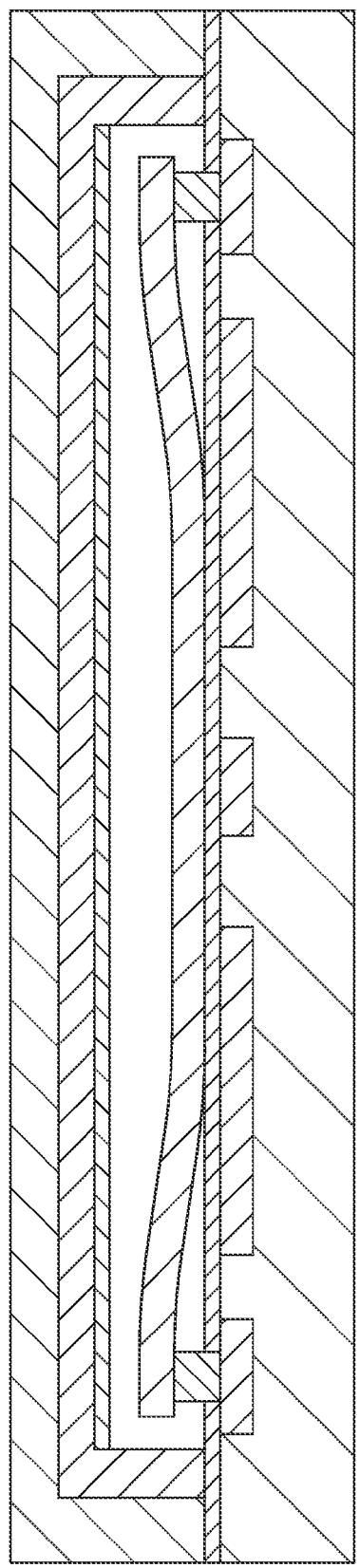
FIG. 2 is a schematic cross-sectional illustration of the MEMS DVC device in the $C_{max}$ state.
Figure 3:
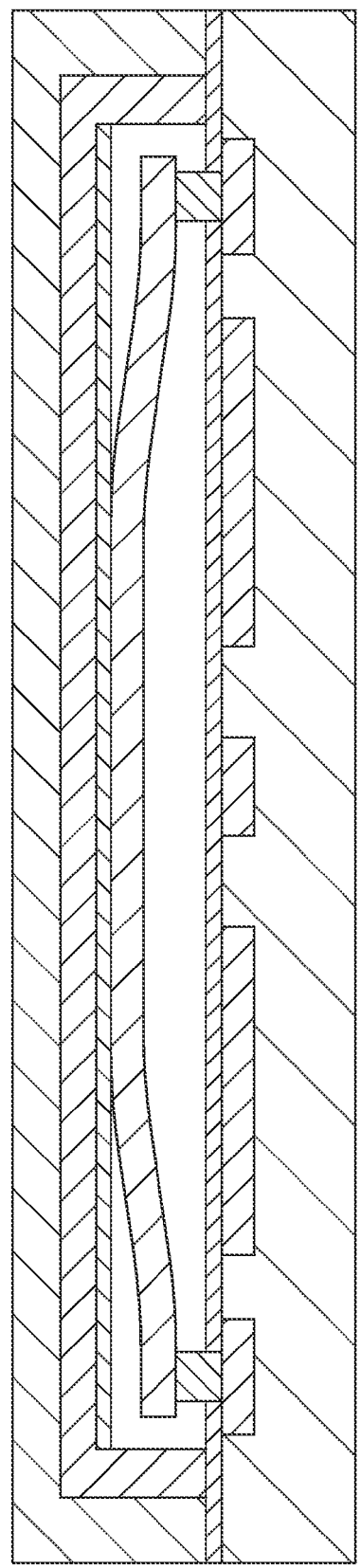
FIG. 3 is a schematic cross-sectional illustration of the MEMS DVC device in the $C_{min}$ state.
Figure 4:
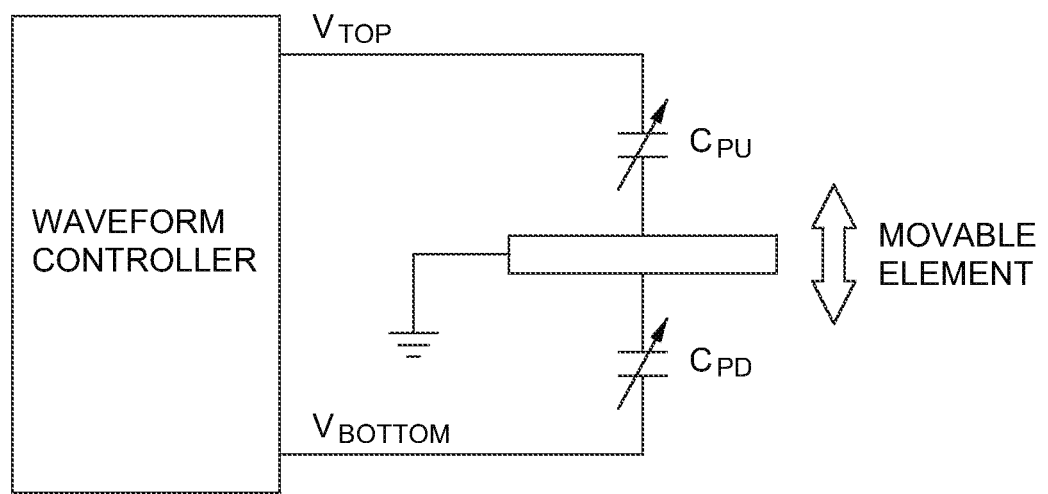
FIG. 4 is a schematic illustration of a waveform controller driving the MEMS DVC device.

The MEMS DVC device may have a control-electrode above (PU-electrode) and below (PD-electrode) the moveable MEMS element, as shown schematically in FIG. 1. In addition an RF-electrode may be present below the moveable MEMS element. As shown in FIGS. 1-3, the PU-electrode, the PD-electrode and the RF electrode are all covered with dielectric material. During operation the MEMS element is either pulled-up or pulled-down in contact with the dielectric material to provide a stable minimum or maximum capacitance to the RF-electrode. In this way the capacitance from the moveable element to the RF-electrode (which resides below the moveable element) can be varied from a high capacitance $C_{max}$ when pulled to the bottom (See FIG. 2) to a low capacitance $C_{min}$ (See FIG. 3) when pulled to the top. The voltages applied to the PD-electrode (Vbottom) and to the top-electrode (Vtop) are typically controlled by a waveform controller (See FIG. 4) to ensure a long-life stable performance of the DVC device. The moveable element is typically on DC-ground.

As shown in FIG. 1-3, the MEMS DVC device may comprise a movable plate disposed in a cavity. The movable plate is coupled to ground and moves between a free standing state shown in FIG. 1 to a $C_{max}$ state shown in FIG. 2 and a $C_{min}$ state shown in FIG. 3, A voltage may be applied to one or more pull-in or pull-down electrodes to pull the plate into close proximity of the RF electrode. The electrodes are covered by a dielectric material. A pull up or pull off electrode may be disposed opposite the pull-in electrodes.

Figure 5A:
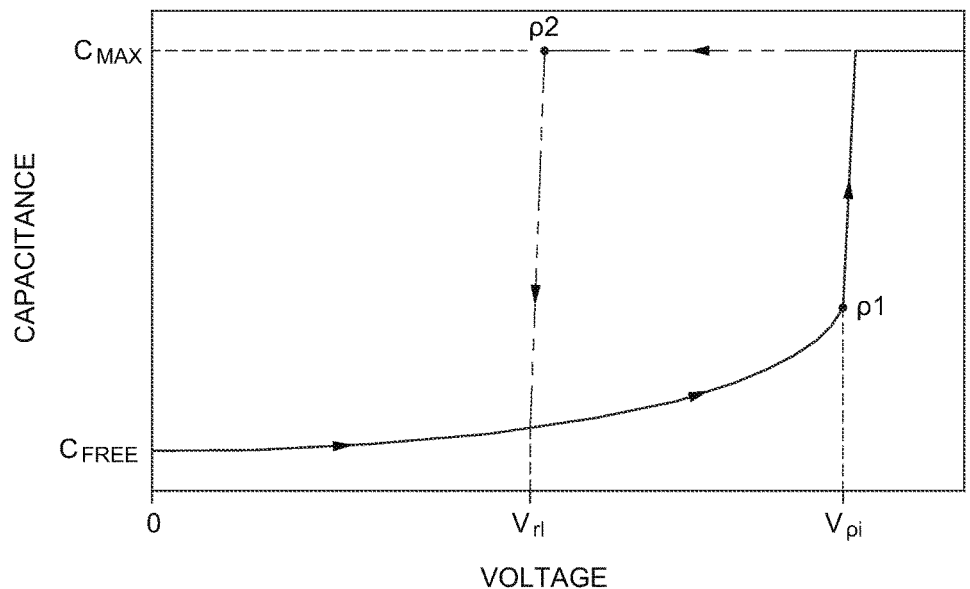
FIG. 5A is a graph showing the hysteresis curve for an electrostatically operated MEMS device when pulled towards the RF electrode with a voltage applied to the pull-down electrodes.

FIG. 5A shows a typical response of the MEMS DVC device to an applied control voltage to the PD-electrode. Initially, the device is in the free-standing state as in FIG. 1 and has a capacitance $C_{free}$. As the voltage on the bottom control electrode is ramped up, the capacitance slowly increases as the movable plate slowly moves closer to the RF electrode until the snap-in point p1 is reached at a voltage Vpi (pull-in voltage). At this point the device (i.e., movable plate) quickly snaps in and the capacitance goes to its maximum value $C_{max}$. Because the gap between the MEMS element and the PD-electrode is now much smaller, the electrostatic force has increased and the voltage has to be reduced down to Vrl (release voltage) in order for the MEMS device to release from the bottom at point p2. The capacitance of the MEMS device is at the maximum value when the MEMS element is in contact with the dielectric material that is disposed on the RF electrode.

Figure 5B:
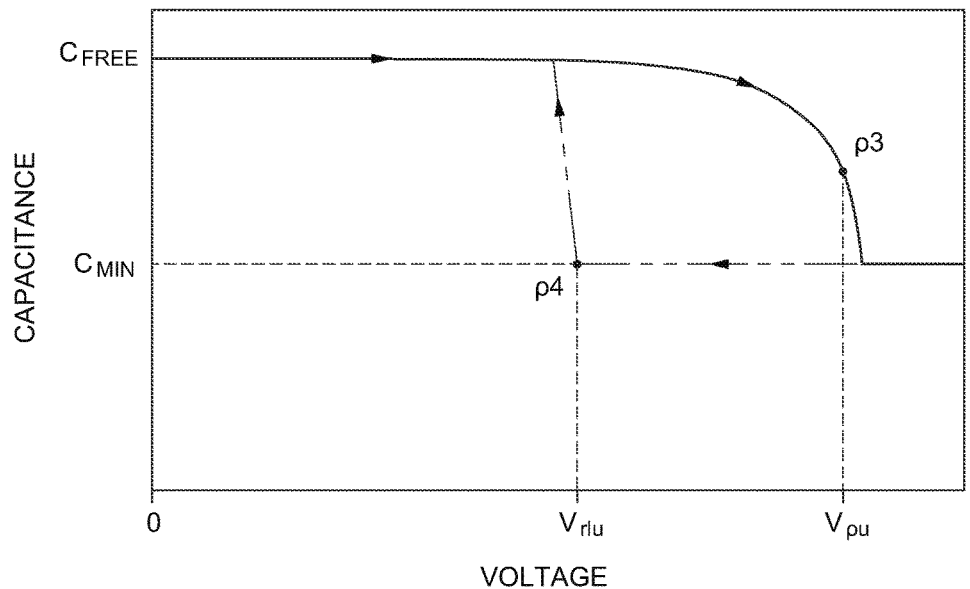
FIG. 5B is a graph showing the hysteresis curve for an electrostatically operated MEMS device when pulled away from the RF electrode with a voltage applied to the pull-up electrodes.

FIG. 5B shows a typical response of the MEMS DVC device to an applied control voltage to the PU-electrode. Initially, the device is in the free-standing state as in FIG. 1 and has a capacitance $C_{free}$. As the voltage on the top control electrode is ramped up, the capacitance slowly decreases as the movable plate slowly moves away from the RF electrode until the snap-in point p3 is reached at a voltage Vpu (pull-up voltage). At this point the device (i.e., movable plate) quickly snaps in and the capacitance goes to its minimum value $C_{min}$. Because the gap between the MEMS element and the PU-electrode is now much smaller, the electrostatic force has increased and the voltage has to be reduced down to Vrlu (release voltage) in order for the MEMS device to release from the top at point p4. The capacitance of the MEMS device is at the minimum value when the MEMS element is in contact with the dielectric material that is disposed on the PU electrode.

The Vpi, Vpu, Vrl and Vrlu are important parameters for the MEMS DVC device. If the pull-in voltage Vpi or Vpu is too high then the waveform controller may not be able to pull the MEMS devices into contact intimately, which can impact the obtainable $C_{min}$ (upward actuation) or $C_{max}$ (downward actuation). If the release voltage Vrl or Vrlu is too low this could indicate stiction which impedes proper device operation. Also, if the release voltage Vrl from the bottom is too low then this will impede the device to be released from the RF-electrode in the presence of an RF signal.

Both Vpi, Vpu, Vrl and Vrlu depend on material parameters (Young's Modulus) as well as geometrical parameters, such as layer thicknesses and CD-control of various layers. Therefore, in production, the MEMS devices will exhibit a certain distribution in these voltages. In order to screen functional devices that meet all required product specs, it is key to test the Vpi, Vpu, Vrl and Vrlu on every device. As discussed herein, a built-in test methodology can be used facilitate the test.

The built-in test methodology is termed as "hysteresis testing." Hysteresis, because the pull-in and release voltages are separated or the pull-in and the release curves do not overlap as shown in FIGS. 5A and 5B. For a reliable part (MEMS DVC) Vpi, Vpu, Vii and Vrlu are designed to be in a certain range. Otherwise they can result in non performance as explained in above paragraphs. Unlike, $C_{max}$ and $C_{min}$, Vpi, Vpu, Vrl and Vrlu are not product specs, i.e. they are not listed on a product sheet but they are the best gauges for estimating the reliability or robustness of the part. Due to process variations, certain parts on a wafer or across the lot may fall outside the range and, if escape screening, can lead to failures in the field. So hysteresis testing allows for screening the bad parts from good.

Figure 6:
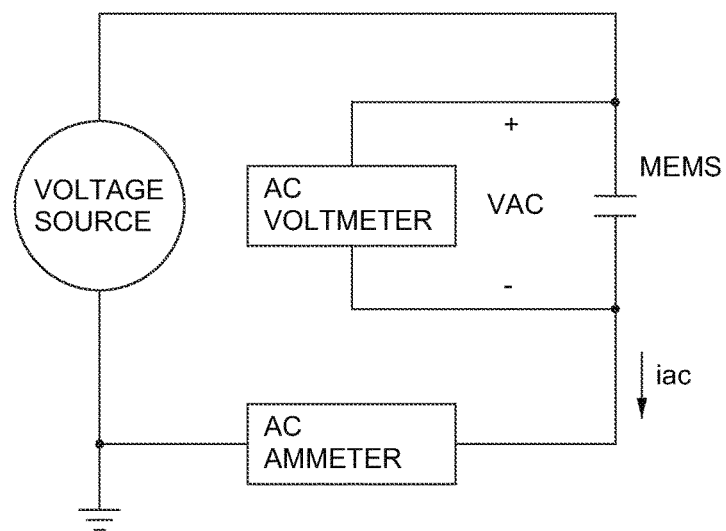
FIG. 6 is a schematic illustration of a two terminal MES device CV configuration.

A typical method for performing a hysteresis test on an electrostatic MEMS device is to perform a CV (capacitance-voltage) sweep. A typical CV sweep can be performed using a CV meter, which uses a combination of a DC source and an AC source to provide the DC bias and the AC signal. The measurements are performed by a combination of an AC voltmeter and an AC ammeter. The basic test configuration to perform a test on a two terminal electrostatic MEMS device is shown in FIG. 6.

The MEMS device capacitance is given by the equation, where f is the frequency of the AC voltage source:

$$C_{MEMS} = i_{ac}/2\pi f^* v_{ac}$$

Figure 7:
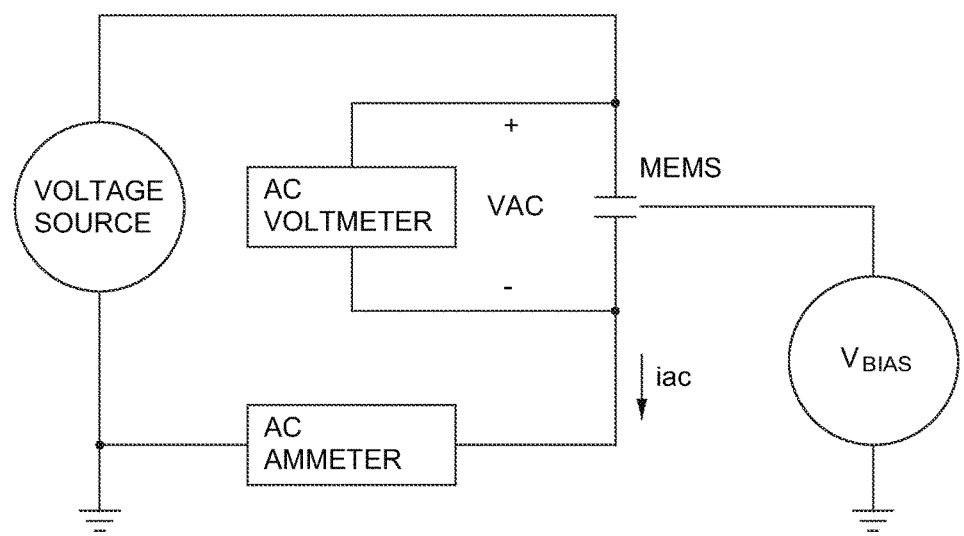
FIG. 7 is a schematic illustration of a three terminal MEMS device CV configuration.

A three or more terminal electrostatic MEMS device does not allow for the same straightforward CV test as shown in FIG. 1. The bias electrodes on the MEMS device provide the actuation bias and are separate from the capacitor electrodes. A CV sweep is performed on this configuration by using the same configuration as shown in FIG. 1, but also including a DC source, Vbias, as shown in FIG. 7. The DC source is used in the same manner as the DC source in FIG. 6.

Figure 8A:
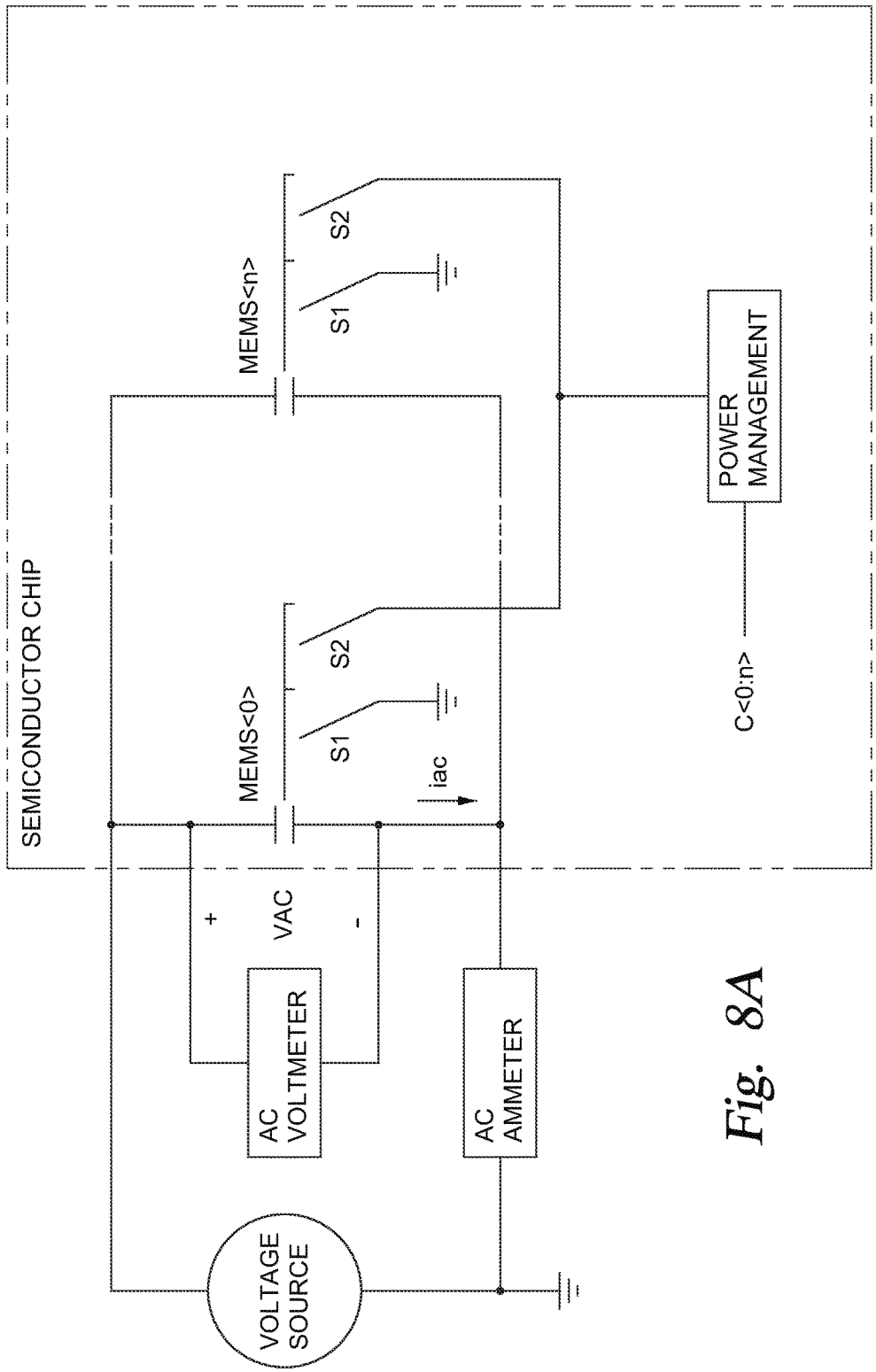
FIGS. 8A and 8B are schematic illustrations of a DFT implementation to test a MEMS hysteresis according to one embodiment.
Figure 8B:
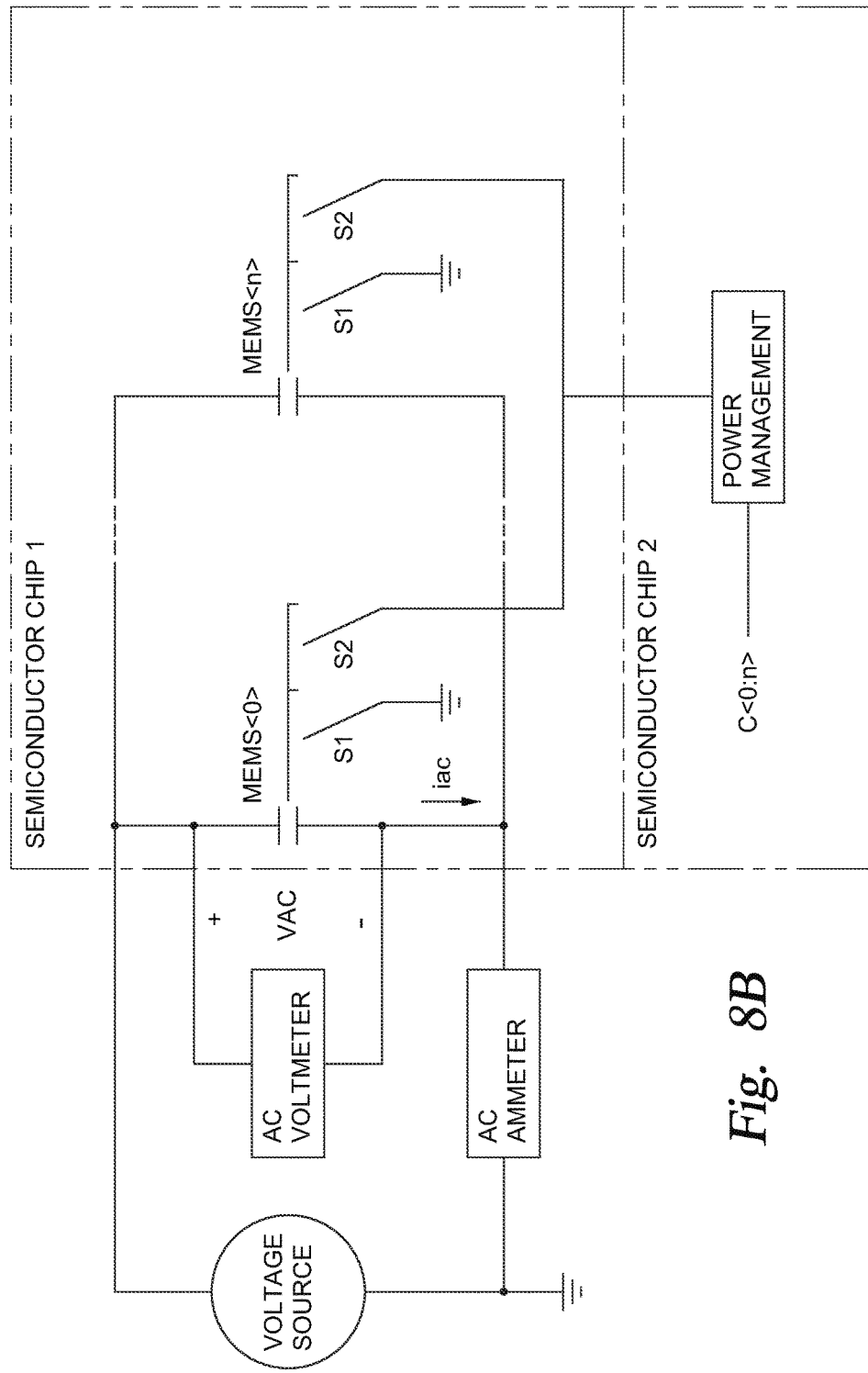

A semiconductor chip can be composed of one or more MEMS transducers and monolithically integrated CMOS control and power management circuitry. This allows for the Vbias power supply in FIG. 7 to be generated internal to the semiconductor chip and not in an external power supply. This is shown in FIGS. 8A and 8B as a plurality of MEMS transducers each with separate switches to the power management. In FIG. 8A, the power management and the MEMS elements are all disposed on a common semiconductor chip. In FIG. 8B, the MEMS elements are disposed on semiconductor chip 1 and the power management is disposed on semiconductor chip 2. The Vbias voltage is generated in the integrated power management circuit and passes to the MEMS transducers through switch S2. The actuation voltage for the MEMS transducers is controlled through the power management, where the level of the output voltage is controlled by the digital control bits C<0:n>, as shown in FIGS. 8A and 8B. The hysteresis sweep can be performed by changing the digital control bits in the power management circuit to the desired actuation voltage. A primary difference between the external power supply version in FIG. 7 and the internal SFT mode in FIGS. 8A and 8B is that the digital control bits hold the value at a discrete number of fixed levels (n) instead of a continuous sweep that can be performed by the external version.

Figure 9:
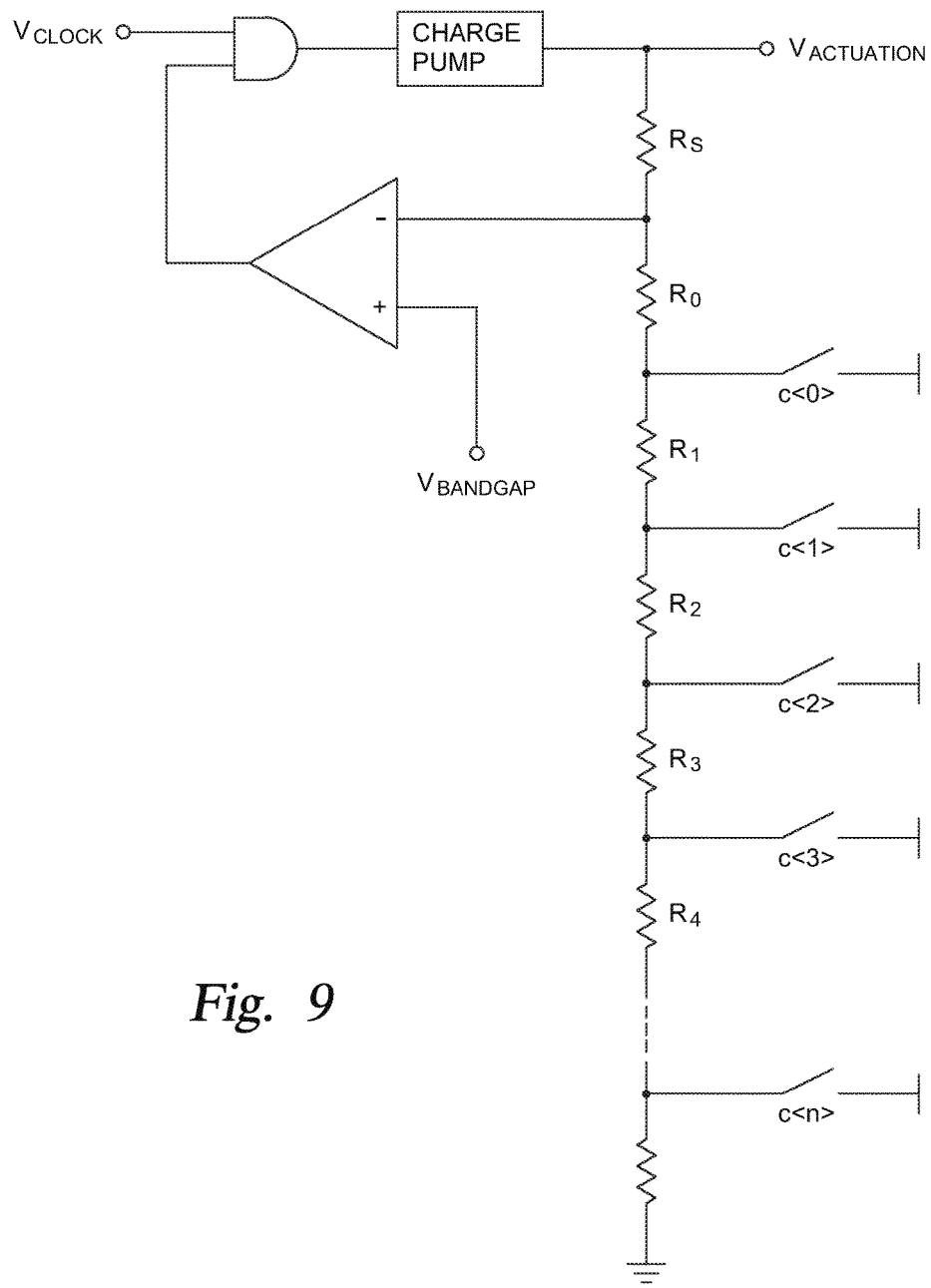
FIG. 9 is a schematic illustration of a power management implementation for MEMS hysteresis testing according to one embodiment.

One representation of a power management circuit that can allow for discrete levels of output voltage is a charge pump with a regulator. In the simple case in FIG. 9, the charge pump clock is gated by the output of the comparator. The output voltage of the charge pump is divided by the resistor ladder and compared to the bandgap voltage reference. If the voltage reference at the resistor ladder is lower than the value of the bandgap voltage reference voltage, the charge pump clock is on. This condition will allow the charge pump clock to be toggling and the charge pump voltage will be increasing if the charge generation is greater than the output load current. If the voltage reference at the resistor ladder is higher than the value of the bandgap voltage reference, the charge pump clock is off. As shown in FIG. 9, the programming of the voltage level is produced by switching in discrete resistors in the resistor ladder, effectively changing the voltage on the compare node to produce a higher or lower output voltage set point. In this manner, the value of the output voltage is programmed by the address bits C<0:n>.

As shown in FIG. 9, the value of Vactuation will be programmed to be a resistor ratio as compared to the Vbandgap voltage as shown by the following equation for a programmation of c<0>:

$$V\text{actuation} = ((Rs+R0)/R0)^* V\text{bandgap}$$

The value for Vactuation with a c<1> programmation is:

$$V\text{actuation} = ((Rs+R0+R1)/(R0+R1))^* V\text{bandgap}$$

The value for Vactuation with a c<n> programmation is:

$$V\text{actuation} = ((Rs+R0-R1+R2 \ldots +Rn)/(R0+R1+R2+ \ldots Rn)^* V\text{bandgap}$$

For a discrete hysteresis curve using this OFT method, the test method consists of a voltage programming using the C address bits, a wait time for settling, and a measurement strobe of the capacitance.

Figure 10:
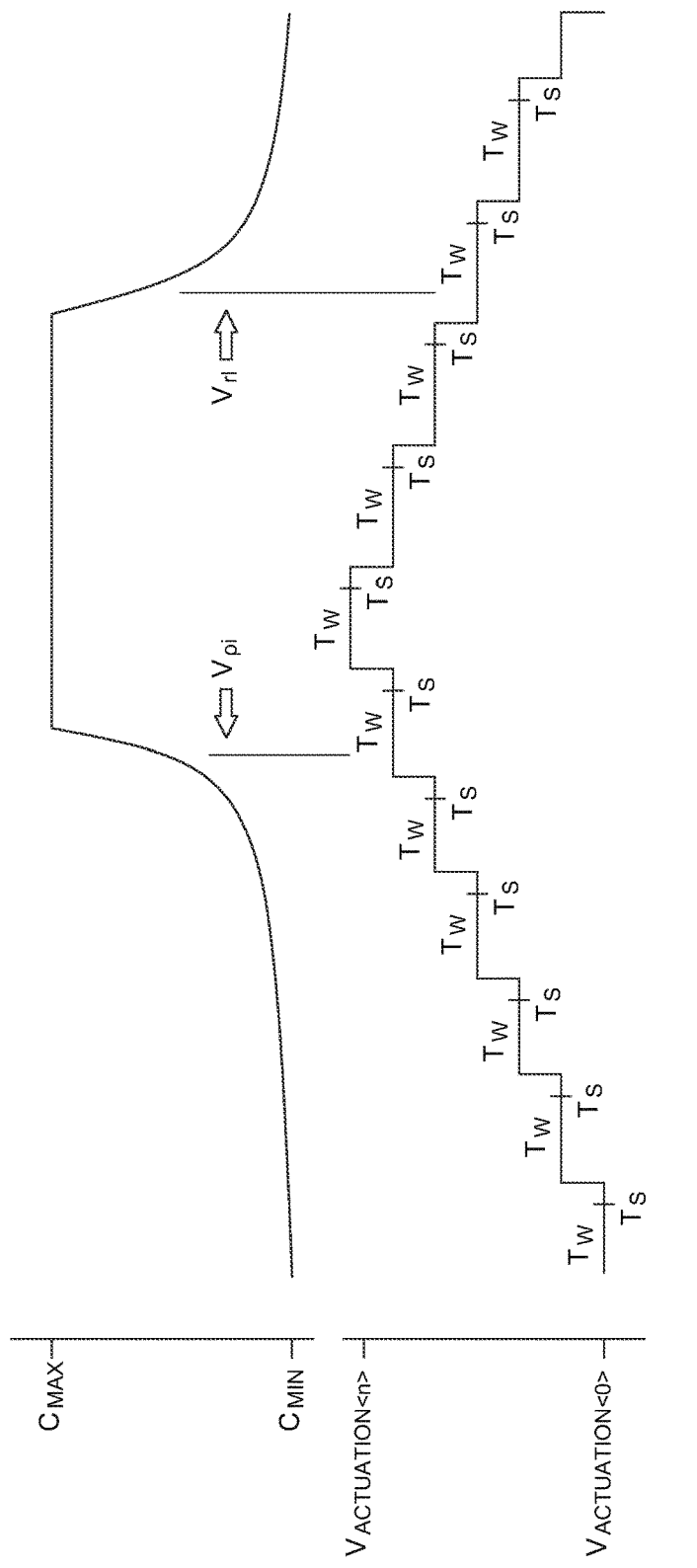
FIG. 10 is a schematic illustration of test methodology for a discrete capacitance hysteresis test using an internal DFT according to one embodiment.

The test is implemented in the hardware configuration shown in FIG. 10. The device under test, or DUT, is preset using the address bits to the regulator to output a voltage level to the MEMS that is lower than the Vpi. After the DUT is powered up, a wait time, or Tw, for voltage and MEMS settling is implemented in the test sequence before the capacitance level is measured by the CV meter at time Ts. After the capacitance is measured, the address bits are incremented to the next voltage level and the measurement is performed using the same timing. Once the Vpi is detected, the address bits are decremented and the measurements taken until the capacitance meter detects ctrl. By utilizing this test sequence, along with the internal DFT, a continuous hysteresis curve can be represented by discretizing the voltage levels as shown in FIG. 10.

Figure 11A:
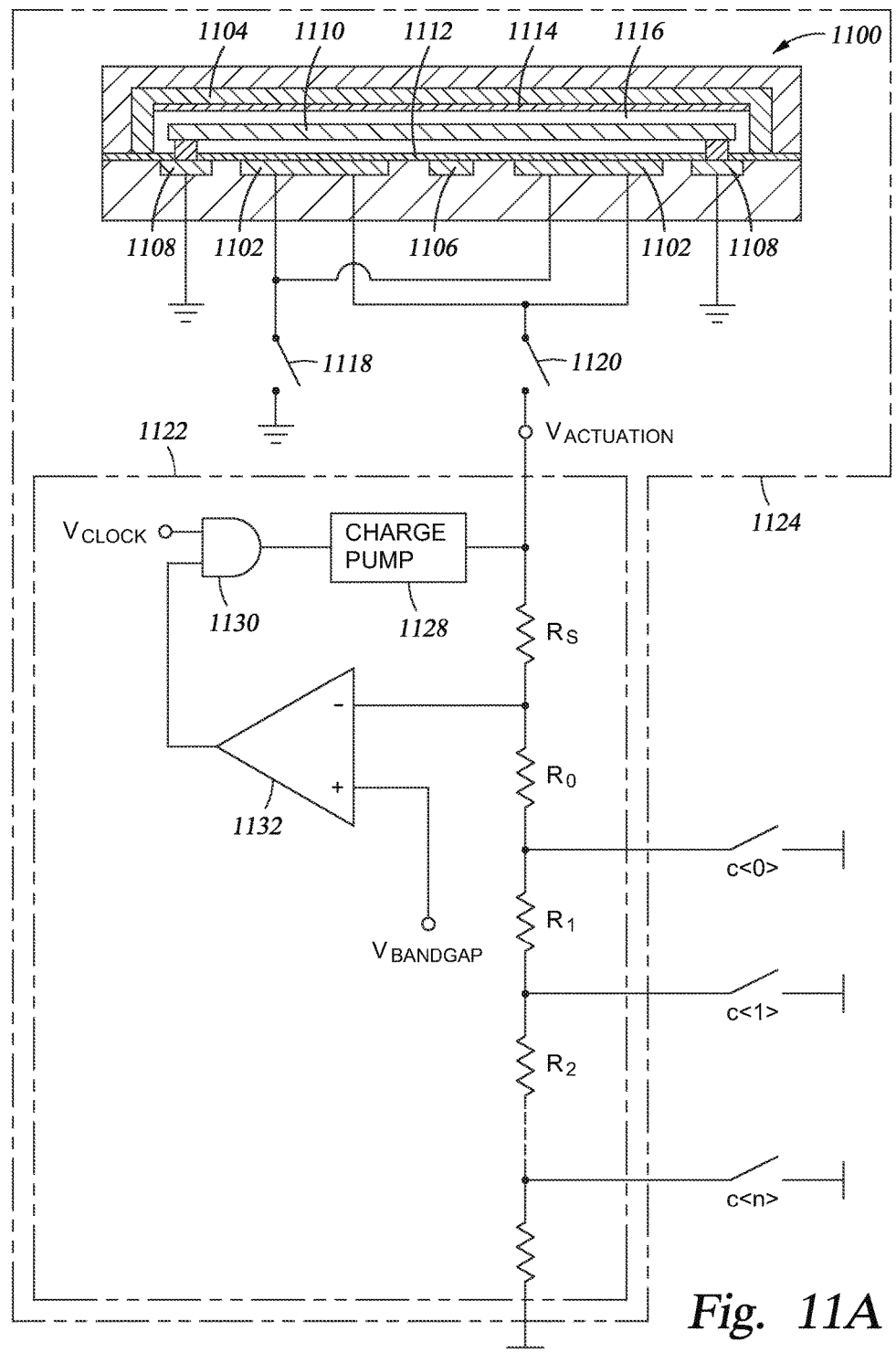
FIGS. 11A-11C are schematic illustrations of a DFT implementation to test a MEMS hysteresis according to additional embodiments.
Figure 11B:
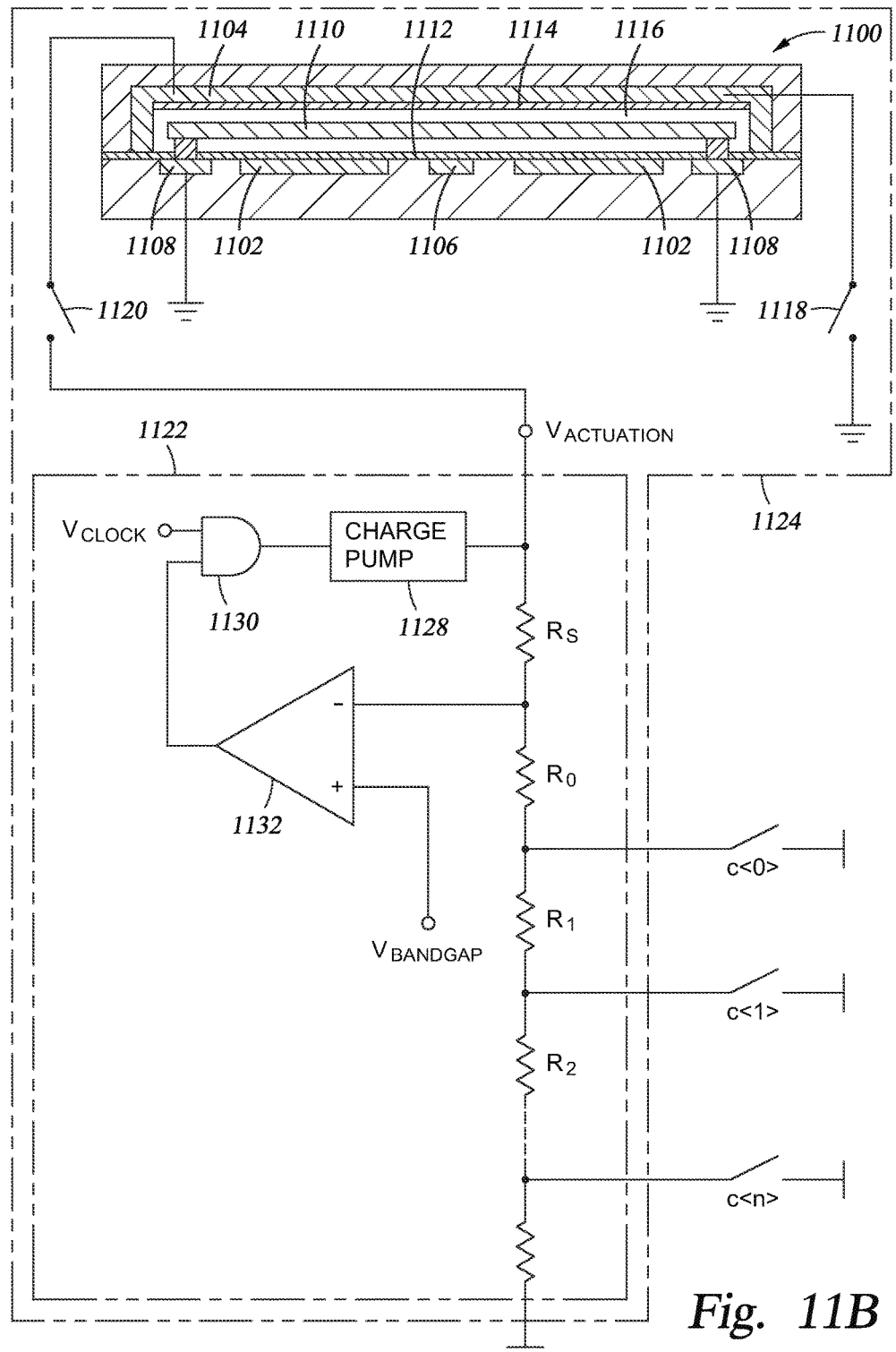

FIGS. 11A and 11B are schematic illustrations of a DFT implementation to test a MEMS hysteresis according to additional embodiments. FIG. 11A shows an embodiment where the test is performed for voltage applied to the pull-down electrode 1102 while FIG. 11B shows an embodiment where the test is performed for voltage applied to the pull-up electrode 1104. It is contemplated that the test may be performed on both the pull-down electrode 1102 and pull-up electrode 1104.

The MEMS device 1100 includes the pull-down electrodes 1102, the pull-up electrode 1104, an RF electrode 1106 and ground electrodes 1108. The ground electrodes 1108 are connected to ground and to the movable plate 1110.

A dielectric layer 1112 is disposed over the pull-down electrodes 1102 and the RF electrode 1106. Another dielectric layer 1114 is disposed between the pull-up electrode 1104 and the cavity 1116 within which the movable plate 1110 is disposed.

As shown in FIG. 11A, the pull-down electrodes 1102 are coupled to multiple switches 1118, 1120. The first switch 1118, when engaged, connects the pull-down electrodes 1102 to ground. In FIG. 11B, when the first switch 1118 is engaged, the pull-up electrode 1104 is connected to ground. The second switch 1120, in FIG. 11A, is connected to a power management device 1122. Similarly, in FIG. 11B, the second switch 1120 is connected to the power management device 1122. Thus, when the second switch 1120 is engaged, the pull-down electrode 1102 (FIG. 11A) or the pull-up electrode 1104 (FIG. 11B) is connected to the power management device 1122. The power management device 1122 and the MEMS device 1100 are both disposed in a single package represented by box 1124. It is to be understood that the power management device 1122 and the MEMS device 1100 are disposed in a single package. In one embodiment, the single package may comprise a single chip having both the power management device 1122 and MEMS device 1100 disposed thereon. In another embodiment, the single package may comprise separate chips that operate collectively as a single entity wherein the MEMS device 1100 is on a first chip and the power management device 1122 is disposed on a second chip.

The power management device 1122 includes a charge pump 1128 that is coupled to a gate 1130. The gate 1130 is coupled to both the Vclock node and the output from a comparator 1132. The comparator has inputs from the Vbandgap node and the resistive ladder. The resistive ladder is what divides the output of the charge pump 1128. The resistive ladder includes a plurality of resistors R0 . . . Rn which are coupled together in series. The address bits $c<0>$, $c<1>$, $c<n>$ are programmed to incrementally "actuate" or operate such that the next voltage level is achieved and the capacitance of the MEMS device 1100 is measured. Hence, an incremental voltage is applied by operating the address bits $c<0>$, $c<1>$, $c<n>$. Based upon the incremental voltage increase, the actuation voltage Vpi to the pull-in electrode (for FIG. 11A) or the actuation voltage to the pull-up electrode (for FIG. 11B) is determined. Similarly, by decrementally decreasing the voltage (i.e., operating the address bits $c<0>$, $c<1>$, $c<n>$), the capacitance is again measured and the release voltage Vrl from the bottom electrode (for FIG. 11A) or the release voltage from the top electrode (for FIG. 11B) is detected. As such, the hysteresis curve for the particular MEMS device 1100 is determined. It is to be understood that multiple MEMS devices may be coupled to the power management device 1122. The multiple MEMS devices may collectively operate as a DVC.

Figure 11C:
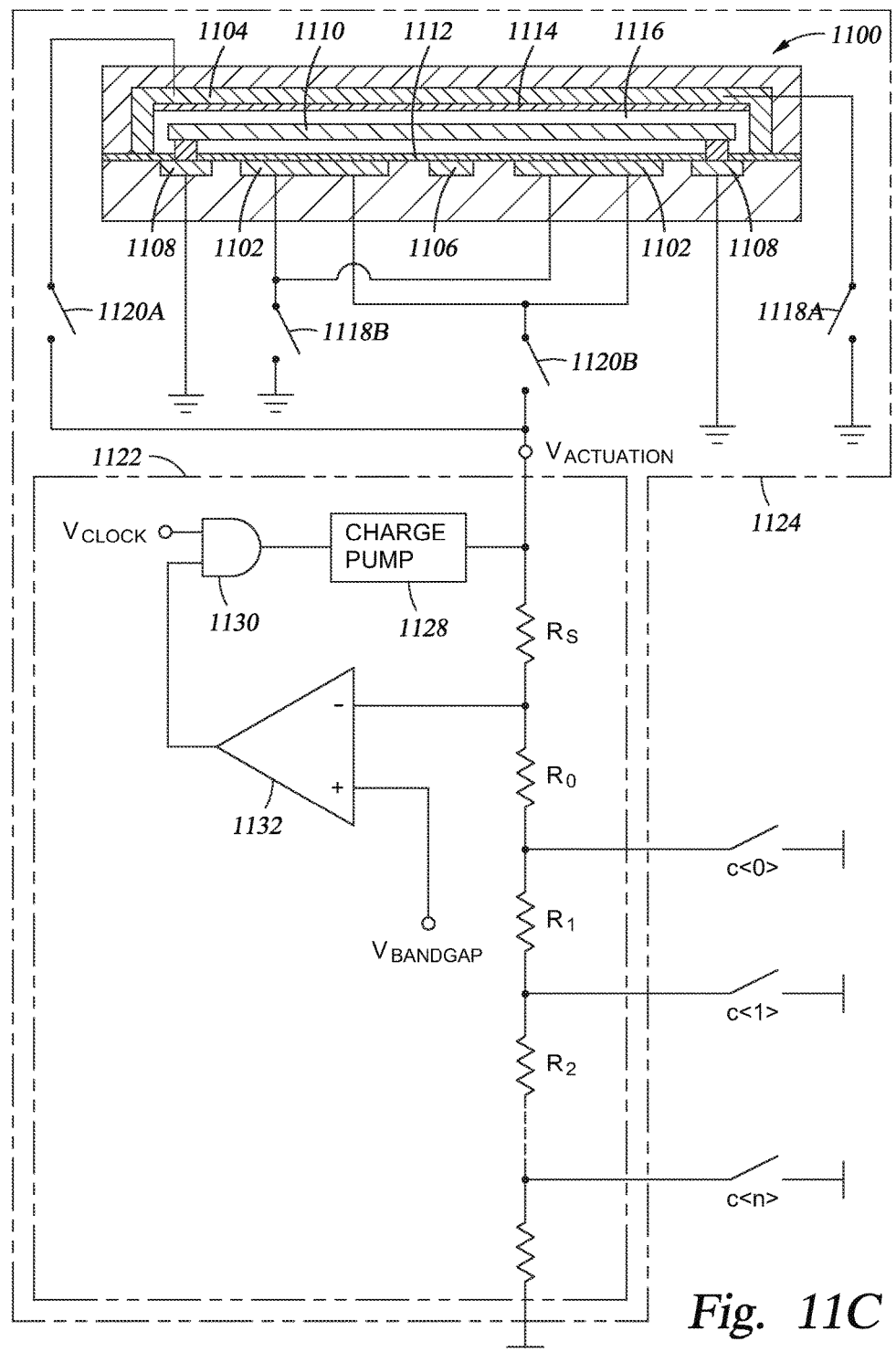

FIG. 11C shows an embodiment with four switches 1118A, 1118B, 1120A, 1120B whereby both the pull up-electrode 1104 and the pull-down electrode 1102 are coupled to the power management device 1122 and to ground. The pull-up electrode 1104 is coupled to ground through switch 1118A and to the power management device 1122 through switch 1120A, The pull-down electrodes 1102 are coupled to ground through switch 1118B and to the power management device 1122 through switch 1120B. During operation, when the movable plate 1110 is pulled down by the pull-down electrodes 1102, switch 1120B is connected to the power management device 1122 and switch 1118B is disengaged from ground. Simultaneously, the pull-up electrode 1104 is grounded whereby switch 1118A is connected to ground and switch 1120A is disengaged from power management device 1122. When the movable plate 1110 is pulled up, the pull-up electrode 1104 is coupled to the power management device 1122 by switch 1120A which is engaged with the power management device 1122 while switch 1118A is decoupled from ground. Simultaneously, pull-down electrodes 1102 are coupled to ground through switch 1118B while switch 1120B is disengaged from power management device 1122.

Figure 12A:
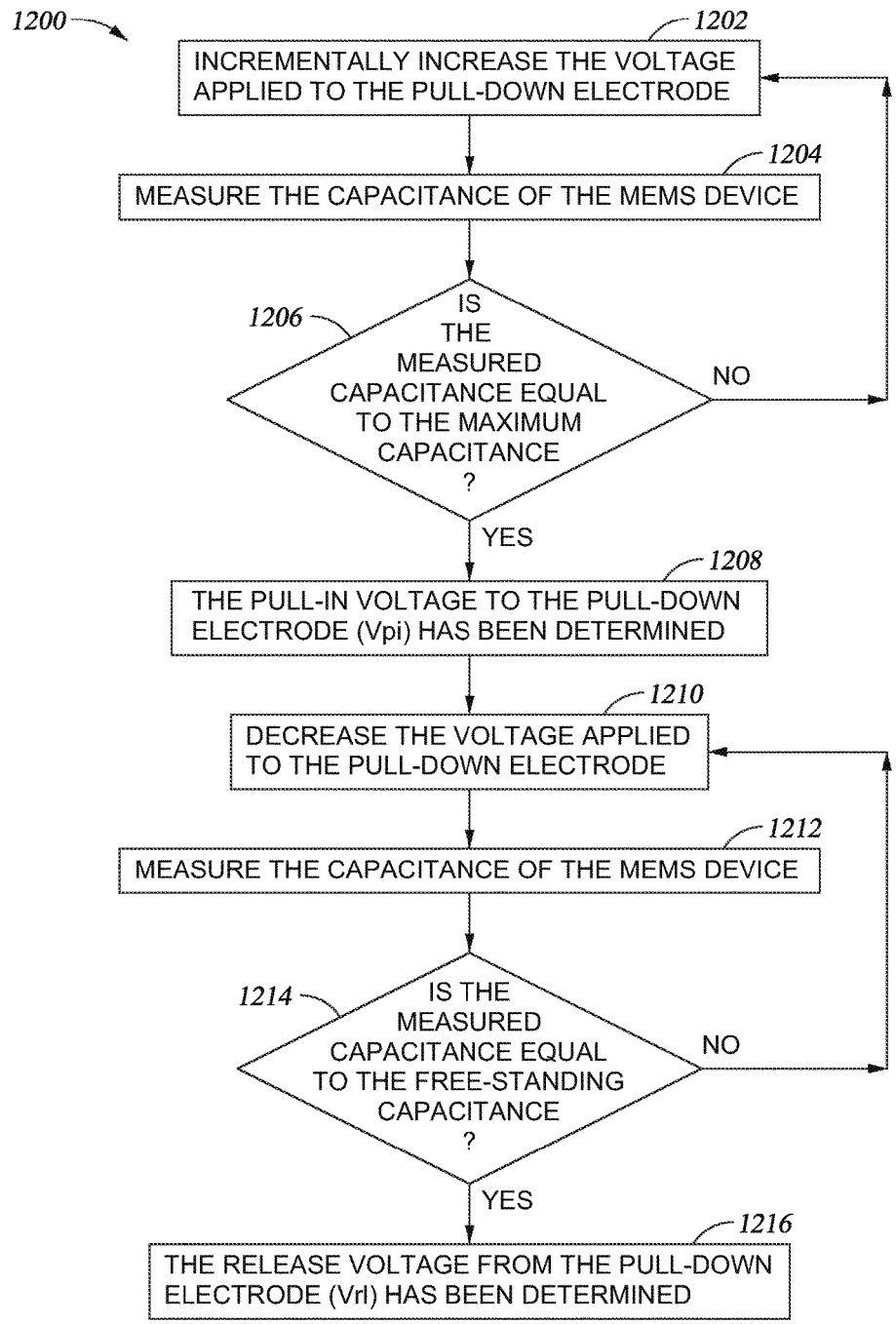
FIGS. 12A and 12B are a flow chart illustrating a method of testing a MEMS DVC according to one embodiment.

FIG. 12A is a flow chart 1200 illustrating a method of testing a MEMS DVC according to one embodiment. Initially, a low voltage is applied to the pull-down electrode in step 1202. The voltage applied to the pull-down electrode is to pull the movable plate closer to the RF electrode and will result in an increase of the MEMS RF-capacitance. After the voltage has been applied, the capacitance of the MEMS device is measured in step 1204. If the capacitance is equal to the maximum capacitance of the MEMS device, then the pull-in voltage Vpi has been determined In step 1208. If the measured capacitance is not equal to the maximum capacitance, then the voltage is incrementally increased in step 1202, with the capacitance measured with each incremental voltage increase in step 1204, until the maximum capacitance is reached and the pull-in voltage has been determined in step 1208.

Once the pull-in voltage Vpi has been determined, the release voltage is determined. The release voltage is determined by reducing the voltage applied to the pull-down electrode in step 1210. The capacitance is then measured in step 1212. If the capacitance is equal to the free-standing capacitance, then the release voltage has been determined. If, however, the measured capacitance is still larger, then the voltage is decrementally reduced in step 1210. The capacitance is measured for each decremental voltage reduction. If the measured capacitance is equal to the free-standing capacitance in step 1214, then the release voltage has been determined in step 1216.

Figure 12B:
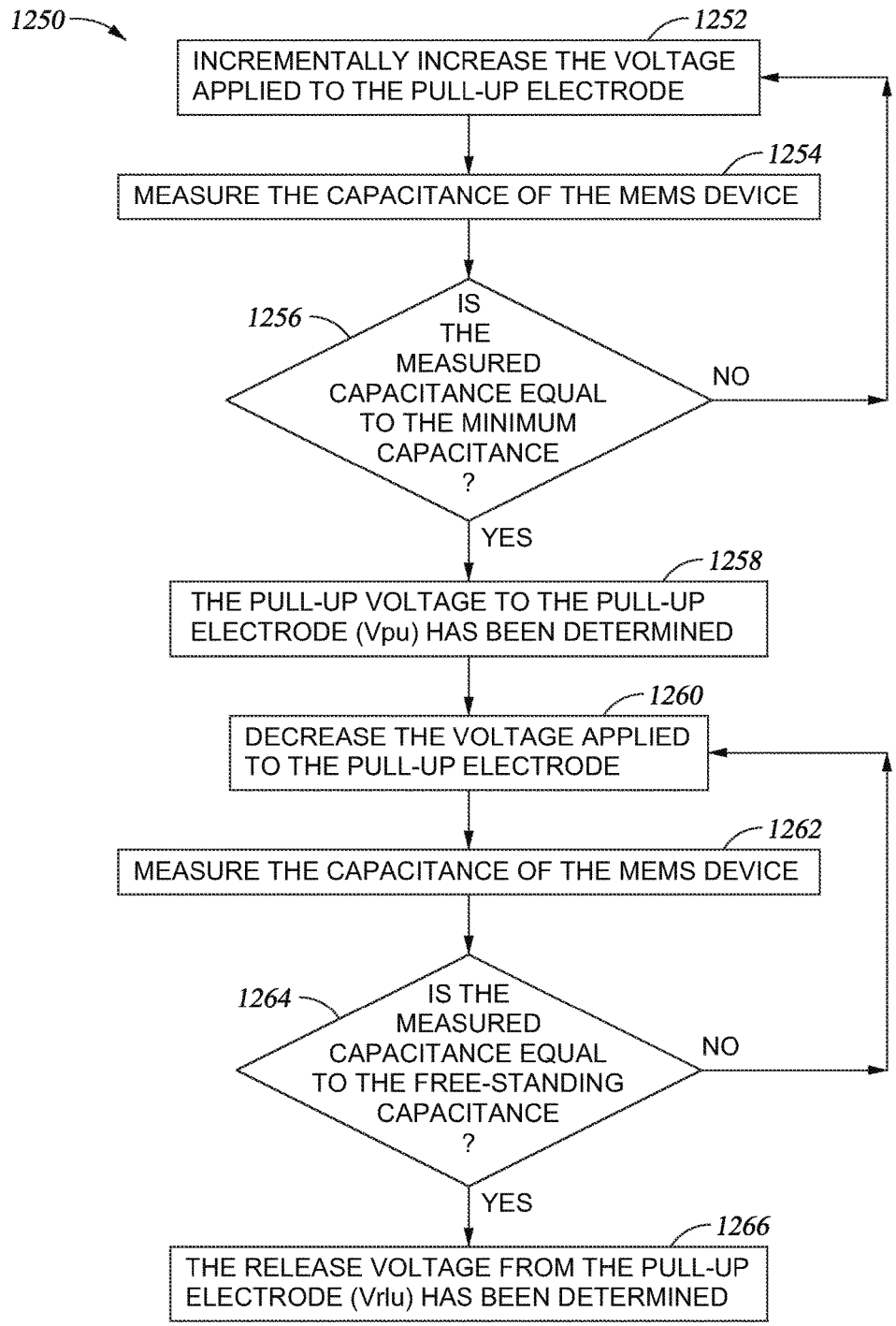

FIG. 12B is a similar flow chart 1250 illustrating a method of testing a MEMS DVC according to one embodiment. Initially, a low voltage is applied to the pull-up electrode in step 1252. The voltage applied to the pull-up electrode is to pull the movable plate away from the RF electrode and will result in a decrease of the MEMS RF-capacitance. After the voltage has been applied, the capacitance of the MEMS device is measured in step 1254. If the capacitance is equal to the minimum capacitance of the MEMS device, then the pull-up voltage Vpu has been determined in step 1258. If the measured capacitance is not equal to the minimum capacitance, then the voltage is incrementally increased in step 1252, with the capacitance measured with each incremental voltage increase in step 1254, until the minimum capacitance is reached and the pull-up voltage has been determined in step 1258.

Once the pull-up voltage Vpu has been determined, the release voltage is determined. The release voltage is determined by reducing the voltage applied to the pull-up electrode in step 1260. The capacitance is then measured in step 1262. If the capacitance is equal to the free-standing capacitance, then the release voltage has been determined. If, however, the measured capacitance is still larger, then the voltage is decrementally reduced in step 1260. The capacitance is measured for each decremental voltage reduction. If the measured capacitance is equal to the free-standing capacitance in step 1264, then the release voltage has been determined in step 1266.

Figure 13A:
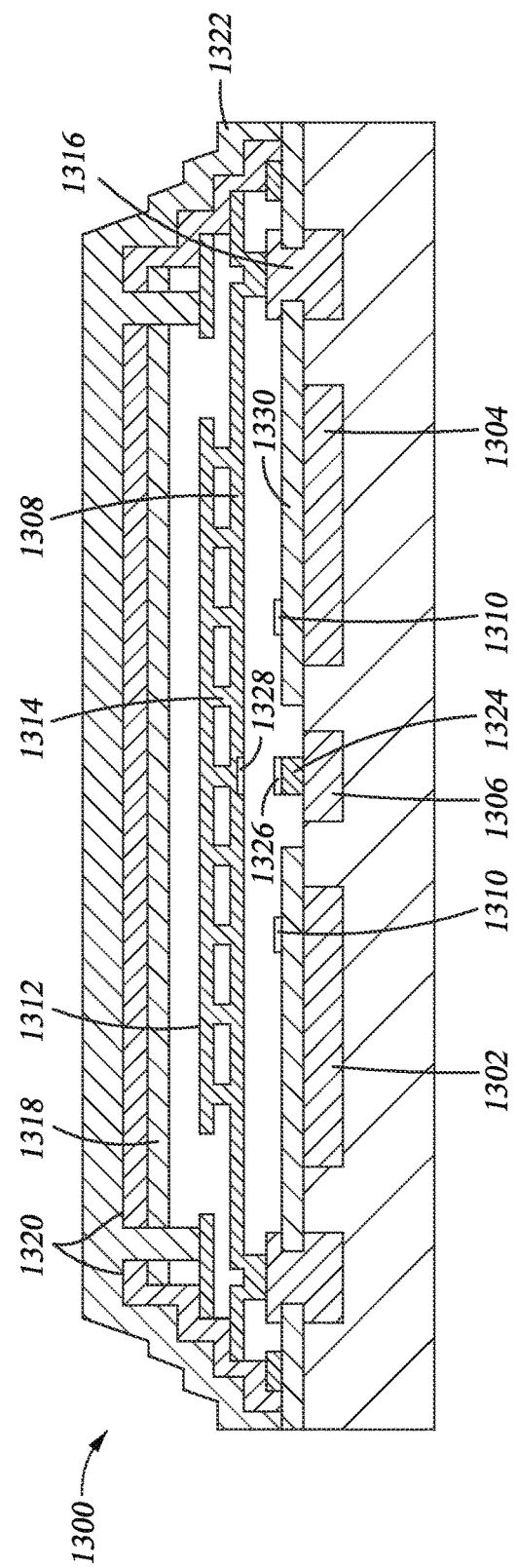
FIG. 13A is a schematic cross-sectional illustration of a MEMS DVC device having a MIM capacitor in the free standing state.

It is to be understood that the embodiments disclosed herein are not limited to the MEMS DVC using the MEMS such as shown in FIG. 1-3. The embodiments disclosed herein are applicable to MEMS DVC using MIM capacitors in the MEMS device. FIGS. 13A-13C show a MEMS device using a MIM capacitor that is applicable to the embodiments discussed herein.

FIG. 13A is a schematic cross-sectional illustration of a MEMS DVC device 1300 having a MIM capacitor in the free standing state. FIG. 13B is a schematic cross-sectional illustration of the MEMS DVC device 1300 of FIG. 13A in the $C_{max}$ state. FIG. 13C is a schematic cross-sectional illustration of the MEMS DVC device 1300 of FIG. 13A in the $C_{min}$ state. The MEMS DVC device 1300 includes pull-in electrodes 1302, 1304 and an RF line 1306. The RF line 1306 extends throughout the cavity of the MEMS DVC and is common to one or more MEMS devices within the cavity. The MEMS bridge includes a layer 1308 that lands on bumps 1310 that overlie the pull-in electrodes 1302, 1304. The top layer 1312 of the MEMS bridge is connected to the bottom layer 1308 by one or more posts 1314. The layers 1308, 1312 and posts 1314 comprise a conductive material. The top layer 1312 may not extend all the way to the ends of the structure, making layer 1312 shorter in length than layer 1308. The grounded MEMS bridge is connected to the underlying metallization though via 1316. An insulating layer 1318 is capped with metal electrode 1320 which is used to pull the MEMS bridge up to the roof for the $C_{min}$ state. This helps reduce the capacitance of the switch in the $C_{min}$ state. A top insulating layer 1322 which fills the etch holes used to remove the sacrificial layers. The top insulating layer 1322 enters these holes and helps support the ends of the cantilevers, while also sealing the cavity so that there is a low pressure environment in the cavities.

To form the MIM, landing posts 1324 are present that are conductive and make contact with the conducting underside of the MEMS bridge. A surface material, such as a metal feature 1326 is disposed on the conducting post 1324 that provides good conductivity, low reactivity to the ambient materials and high melting temperature and hardness for long lifetime. The underside of the MEMS bridge may be coated with an insulator but a window is opened on the underside of the MEMS bridge to provide a conducting region 1328 for the conducting post 1324 to make electrical contact with when the MEMS bridge is pulled down. A dielectric layer 1330 is formed over the pull-in electrodes 1302, 1304, but not the RF line 1306.

Figure 13D:
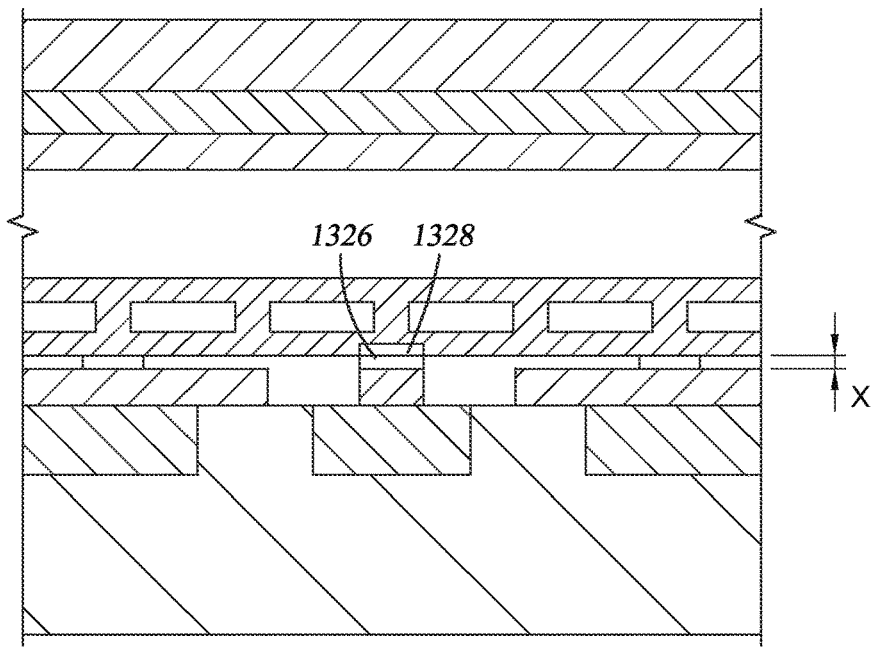
FIG. 13D is a schematic cross-sectional close up illustration of the MEMS DVC shown in FIG. 13A.
Figure 13E:
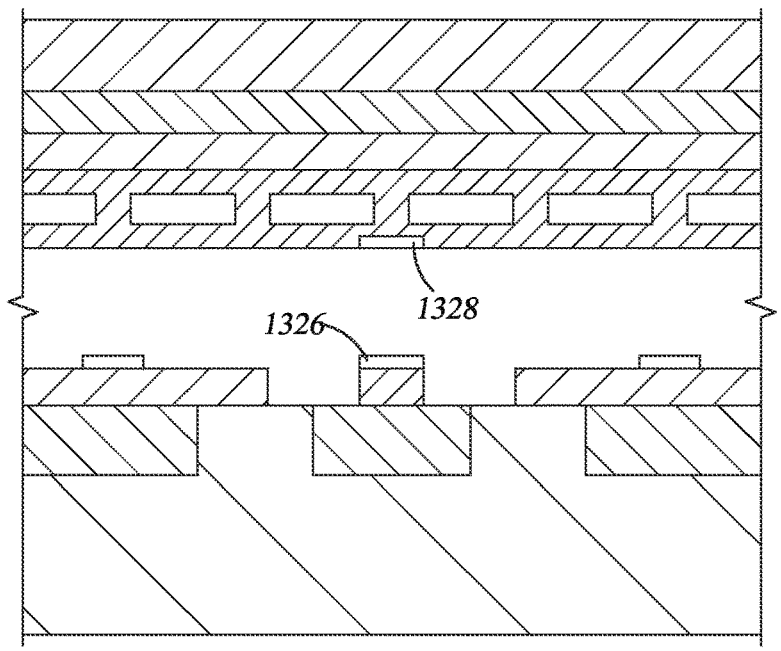
FIG. 13E is a schematic cross-sectional close up illustration of the MEMS DVC shown in FIG. 13B.

FIG. 13B shows the MEMS bridge pulled in with voltages applied to pull-in electrodes 1302, 1304 so that the layer 1308 lands on the insulated bumps 1310. The conducting region 1328 of the MEMS bridge lands on the two conducting post 1324 (only one shown as the other is behind it), which gives the low resistance state. FIG. 13C shows the MEMS bridge after it has been pulled to the roof using electrode 1320. The MEMS bridge makes contact with the insulating layer 1318. This prevents any electrical contact between the pull up electrode 1320 and the MEMS bridge. The region in the dotted rectangles is shown in FIGS. 13D and 13E.

Although not shown in these figures, there may be an insulating layer over the top and most of the underside of the MEMS bridge. A hole is made in the insulator on the underside of the cantilever to allow it to make contact with the conducting post 1324. In this state the resistance of the MEMS bridge to the RF line is very large and the capacitance coupling to that line is small.

Figure 14:
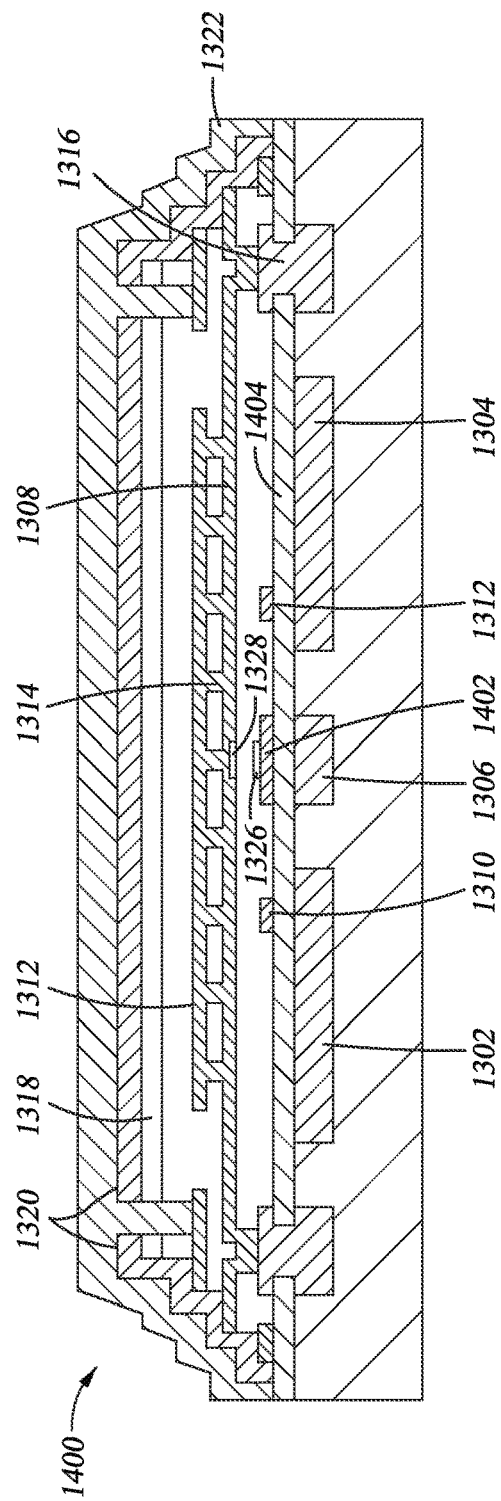
FIG. 14 is a schematic cross-sectional illustration of a MEMS DVC device according to another embodiment.

The embodiments discussed herein are also applicable to hybrid ohmic-MIM devices, FIG. 14 is a schematic cross-sectional illustration of a MEMS DVC device 1400 according to another embodiment. In the embodiment shown in FIG. 14, a surface material, such as a metal feature 1402 is disposed on the conducting post 1324 that provides good conductivity, low reactivity to the ambient materials and high melting temperature and hardness for long lifetime. The dielectric layer 1330 that covered only the pull-in electrodes 1302, 1304 is replaced with a dielectric layer 1404 that is deposited on top of pull in electrodes 1302, 1304 and on top of RF line 1306, The metal feature 1326, the dielectric layer 1404 and the RF line 1306 implement a MIM capacitor. The top electrode of this MIM is either electrically floating, when the MEMS bridge is in UP position, or grounded via the ohmic contact between surface material 1402 and conducting region 1328, when the MEMS bridge is in DOWN position.

In an alternative embodiment, the metal feature 1402, 1326, which is the top electrode of the MIM, is electrically connected to a reference DC potential by a variable resistor. The reference DC potential can be either the common ground, or a separate terminal of the device. The variable resistor can be implemented, as an example implementation, by a transistor or a separate higher resistance MEMS ohmic switch.

While the foregoing is directed to embodiments of the present invention, other and further embodiments of the invention may be devised without departing from the basic scope thereof, and the scope thereof is determined by the claims that follow.

The invention claimed is:
1. A MEMS DVC, comprising:
   at least one MEMS device, the MEMS device comprising a movable plate, an RF electrode, one or more pull-down electrodes and one or more pull-up electrodes;
   a first switch coupled to either the one or more pull-down electrodes of the MEMS device or the one or more pull-up electrodes of the MEMS device, wherein the first switch is additionally coupled to ground;
   a second switch coupled to either the one or more pull-down electrodes of the MEMS device or the one or more pull-up electrodes of the MEMS device; and
   a power management system coupled to the second switch, wherein the at least one MEMS device, the first switch, the second switch and the power management system are all disposed in a single package.
2. The MEMS DVC of claim 1, wherein the single package comprises a first semiconductor chip having the power management system disposed thereon and a second semiconductor chip having the MEMS device disposed thereon.
3. The MEMS DVC of claim 1, wherein the power management system comprises:
   a charge pump; and
   a resistive ladder coupled between the charge pump and the second switch.
4. The MEMS DVC of claim 3, wherein the power management system further comprises a comparator coupled between the charge pump and the resistive ladder.
5. The MEMS DVC of claim 4, wherein the power management system further comprises a gate coupled between the comparator and the charge pump.
6. The MEMS DVC of claim 5, wherein the comparator is coupled to a bandgap voltage node on the semiconductor chip.
7. The MEMS DVC of claim 6, wherein the gate is coupled to a clock voltage node on the semiconductor chip.
8. The MEMS DVC of claim 7, wherein the resistive ladder comprises a plurality of resistors.

9. The MEMS DVC of claim 8, further comprising a plurality of address bits coupled to the resistive ladder.

10. The MEMS DVC of claim 9, wherein the second switch is coupled to the one or more pull-down electrodes.

11. The MEMS DVC of claim 9, wherein the second switch is coupled to the one or more pull-up electrodes.

12. The MEMS DVC of claim 1, wherein the second switch is coupled to the one or more pull-down electrodes.

13. The MEMS DVC of claim 1, wherein the second switch is coupled to the one or more pull-up electrodes.

14. The MEMS DVC of claim 1, wherein the power management system includes a resistive ladder having a plurality of resistors.

15. The MEMS DVC of claim 14, wherein the resistive ladder is coupled to one or more address bits.

16. The MEMS DVC of claim 15, wherein the plurality of resistors are coupled together in series.

17. The MEMS DVC of claim 1, wherein the first switch is coupled to the one or more pull-down electrodes and the second switch is coupled to the one or more pull-down electrodes, the MEMS DVC further comprising:
 a third switch coupled to the one or more pull-up electrodes and to ground; and
 a fourth switch coupled to the one or more pull-up electrodes and to the power management system.

18. The MEMS DVC of claim 17, wherein the power management system includes a resistive ladder having a plurality of resistors.

19. The MEMS DVC of claim 18, wherein the resistive ladder is coupled to one or more address bits.

20. The MEMS DVC of claim 1, wherein the MEMS DVC includes a MIM capacitor.

21. A method of testing the MEMS DVC of claim 1, the method comprising:
 applying a first voltage to the one or more pull-down electrodes of the MEMS device to move the movable plate from a free standing state capacitance to an increased capacitance state;
 measuring a capacitance of the MEMS device;
 applying a second voltage to the one or more pull-down electrodes of the MEMS device;
 measuring the capacitance of the MEMS device;
 detecting the capacitance of the MEMS device equals a maximum capacitance of the MEMS device;
 removing the second voltage from the one or more pull-down electrodes of the MEMS device;
 measuring the capacitance of the MEMS device;
 removing the first voltage from the one or more pull-down electrodes of the MEMS device;
 measuring the capacitance of the MEMS device; and
 detecting the capacitance of the MEMS device is equal to the free standing state capacitance.

22. A method of testing the MEMS DVC of claim 1, the method comprising:
 applying a first voltage to the one or more pull-up electrodes of the MEMS device to move the movable plate from a free standing state capacitance to a decreased capacitance state;
 measuring a capacitance of the MEMS device;
 applying a second voltage to the one or more pull-up electrodes of the MEMS device;
 measuring the capacitance of the MEMS device;
 detecting the capacitance of the MEMS device equals a minimum capacitance of the MEMS device;
 removing the second voltage from the one or more pull-up electrodes of the MEMS device;
 measuring the capacitance of the MEMS device;
 removing the first voltage from the one or more pull-up electrodes of the MEMS device;
 measuring the capacitance of the MEMS device; and
 detecting the capacitance of the MEMS device is equal to the free standing state capacitance.

* * * * *